United States Patent [19]
Tyson et al.

[11] Patent Number: 5,218,214
[45] Date of Patent: Jun. 8, 1993

[54] FIELD OXIDE TERMINATION AND GATE OXIDE

[75] Inventors: Scott M. Tyson; Gary M. Wodek, both of Colorado Springs, Colo.

[73] Assignee: United Technologies Corporation, Hartford, Conn.

[21] Appl. No.: 950,335

[22] Filed: Sep. 24, 1992

Related U.S. Application Data

[62] Division of Ser. No. 701,739, May 17, 1991.

[51] Int. Cl.⁵ .................... H01L 27/01; H01L 27/13; H01L 29/78; H01L 29/34
[52] U.S. Cl. ...................................... 257/66; 257/353; 257/354; 257/634; 257/637; 257/644; 257/650
[58] Field of Search ................ 257/66, 347, 352, 353, 257/354, 634, 637, 644, 650

[56] References Cited

U.S. PATENT DOCUMENTS 4,974,051 11/1990 Matloubian et al. ............... 257/347
5,124,768 6/1992 Mano et al. .......................... 257/347
5,128,733 7/1992 Tyson .................................. 257/354

Primary Examiner—Andrew J. James
Assistant Examiner—Ngan Van Ngo

[57] ABSTRACT

An integrated circuit has a silicon mesa disposed on a substrate and a field insulator structure in proximity to the mesa and having an opening over a top mesa surface. The opening, which exposes sidewalls in the structure, is positioned with respect to the mesa and has dimensions such that the structure is disposed to overlap a region of the mesa along an outer mesa periphery. A layer of polysilicon extends along a top surface of the structure and into the opening and adjacent to the mesa top surface. An insulator is disposed between the poly layer and the mesa top surface, the insulator having a layer of thermal gate oxide disposed adjacent to the poly layer and having a layer of pyrogenic oxide disposed between the thermal gate oxide layer and the mesa top surface.

10 Claims, 3 Drawing Sheets

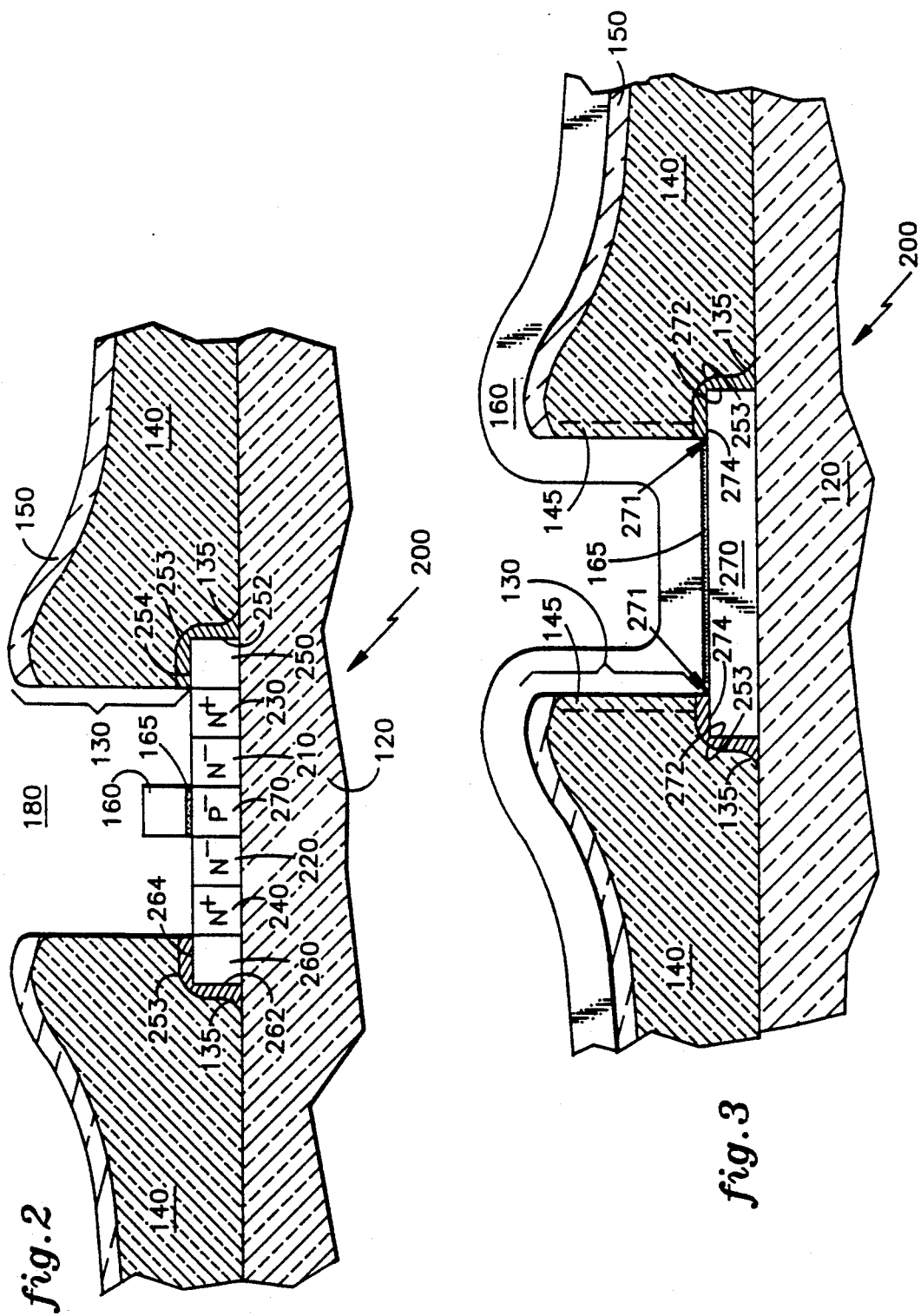

FIELD OXIDE TERMINATION AND GATE OXIDE

This is a division of copending application Ser. No. 701,739, filed on May 17, 1991.

TECHNICAL FIELD

The field of the invention is that of silicon integrated circuit processing.

BACKGROUND ART

It is known in the art that in integrated circuit designs in which a layer of field oxide is placed over a wafer and apertures are cut down through the field oxide by reactive ion etching to form apertures for transistors, there is radiation damage in the sidewalls of the field oxide structure. This is caused by the ionizing radiation produced by the accelerations and collisions of the etch plasma ions and the material in the oxide and the substrate. This radiation has the effect of breaking silicon-oxygen bonds within the field oxide structure. These broken bonds form potential trapping sites that trap stray charge, such as that created by ionizing radiation.

As a result of this radiation damage, the regions under the terminations of the field oxide are relatively leaky due to extensive hole trapping in this oxide. There is leakage current between conductors that are in contact with the leaky surface, such as transistor sources and drains, that is greater than what otherwise would be the case and the breakdown potential between sources and drains of field effect transistors is reduced because current may flow in the parasitic transistor region formed along the edge of the field oxide structure between a source and a drain.

DISCLOSURE OF INVENTION

The invention relates to a process for treating the sidewalls of an aperture cut through a field oxide structure to a transistor site, in which a series of oxidation steps combine to restore broken bonds and/or also to passivate or reconstitute the damage sites.

In a field effect transistor process employing the invention, the same process is used to treat the sidewalls and to form the final transistor gate insulator.

A feature of the invention is the incorporation of a layer of pyrogenic oxide in the gate insulator of a field effect transistor (FET).

Another feature of the invention is the use of relatively low temperatures in the formation of the gate insulator.

Other features and advantages will be apparent from the specification and claims and from the accompanying drawings which illustrate an embodiment of the invention.

BRIEF DESCRIPTION OF DRAWINGS

FIG. 2 is a cross section along lines A—A of FIG. 1.

FIG. 3 is a cross section along lines B—B of FIG. 1.

BEST MODE FOR CARRYING OUT THE INVENTION

Figure 1:
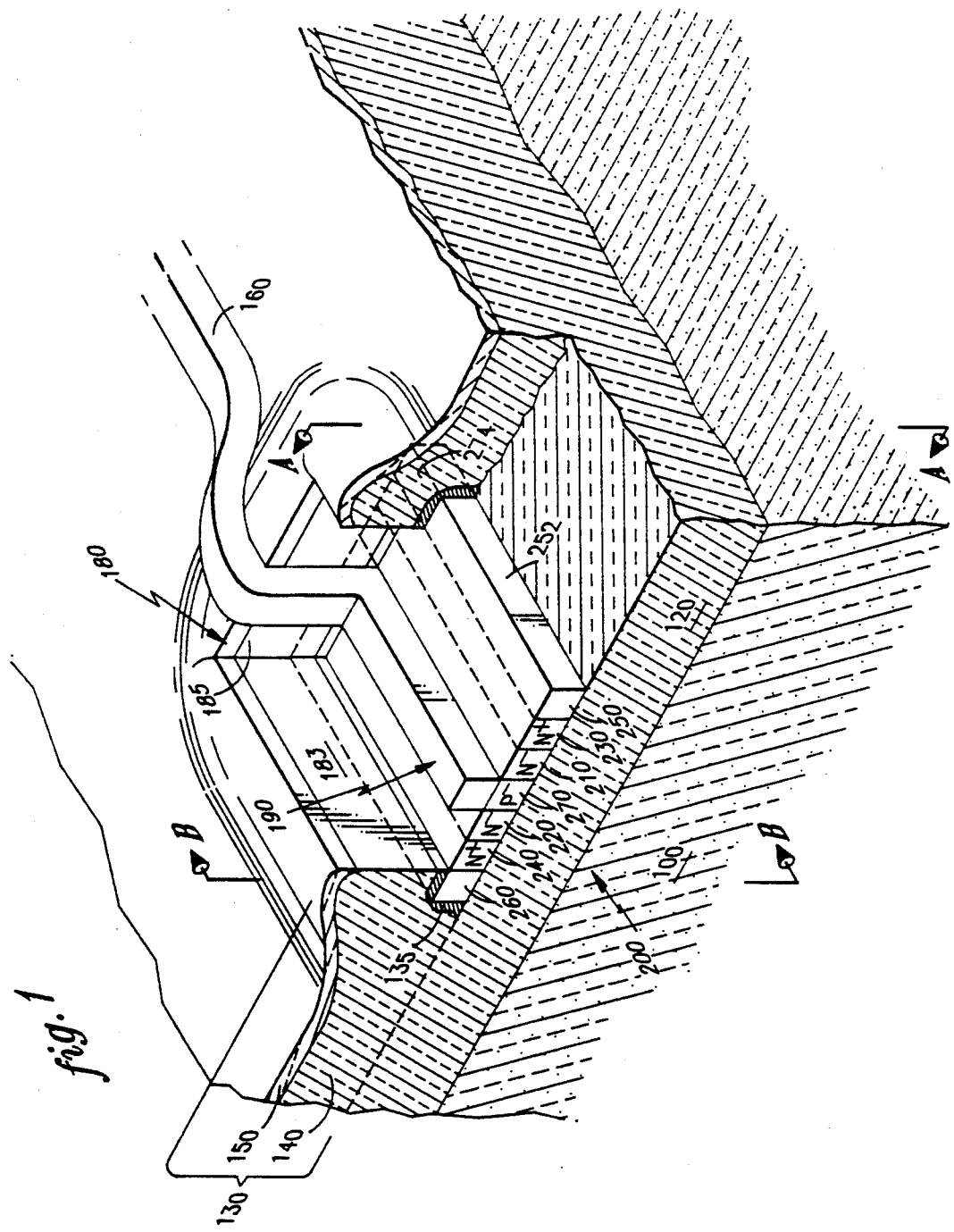
FIG. 1 is a perspective view of a transistor and field oxide constructed according to the invention.

Referring now to FIG. 1, there is shown in perspective a silicon mesa doped to a conventional concentration, referred to by the numeral 200, resting on a buried oxide layer 120 that is formed within a substrate 100 and exposed by earlier processing in a silicon on insulator (SOI) wafer. A preferred field oxide structure, (disclosed in U.S. Pat. No. 5,037,781, which is hereby incorporated by reference, referred to by the collective numeral 130 and comprising a layer of a thermal (sometimes referred to as dry) oxide 135, a deposited boron phospho-silicate glass layer 140 and a deposited oxide layer 150 is put down over the entire wafer. Thermal oxide layer 135 will be relatively thicker over mesa 200, since oxide layer 120 has a smaller proportion of unreacted silicon than mesa 200. Other field insulators may be used as appropriate for different circumstances. An aperture 180, sometimes referred to as the active cut, is opened up in layer 130 of a size such that the field structure 130 overlaps the mesa in an overlap area. This aperture will define the active area for transistor fabrication. In a later processing step, a gate oxide will be grown within the aperture. Within mesa 200, two regions 250 and 260 are shown on the right and left edges, respectively, as being in the overlap area covered by insulator 130. A polysilicon strip 160 enters from the upper right of the drawing, descends into aperture 180 and forms the gate of a field effect transistor 190 formed within mesa 200 and having a channel 270, bracketed by the source and drain. The lightly doped source and drain areas are denoted by numerals 220 and 210 respectively. The heavily doped portions of the source and drain are denoted by numerals 240 and 230, respectively. The source and drain are collectively referred to as the transistor electrodes. They are implanted with conventional energies and doses. Cross sections are taken along lines A—A and B—B to show this device in more detail.

Referring now to FIG. 2, there is shown cross section A—A taken perpendicular to the axis of polysilicon (poly) gate 160. Poly gate 160 is separated from a channel 270 by gate oxide 165 that will be described in more detail below. Preferably, gate oxide 165 is grown separately from oxide 135, to avoid contamination from intermediate steps between the time layer 135 is grown and the time layer 165 is grown. At the left and right edges, thermal oxide layer 135 of field insulator 130 rises up and over the portions 260 and 250 of mesa 200. In the prior art, the vertical edges of aperture 180 were beyond the edge of mesa 200, separated from it by tolerance variations. In the past, the thermal, or gate oxide extended up the mesa sidewalls 262 and 252, and over the overlap area surfaces 264 and 254, so that there was a problem of electrical breakdown between the poly conductor that formed the gate or a poly interconnection and a conductor, such as a source or drain in mesa 200, at the corners of the mesa where oxide 135 was thinner and the field strengths higher.

Referring now to FIG. 3, there is shown a cross section B—B taken along the axis of polysilicon gate 160. Gate oxide 165 lies below gate 160 and thermal oxide 135 extends under field structure 130 and along both vertical edges 272 of mesa 200. Two areas on the left and right of the mesa denoted by the numerals 274, are the overlap areas corresponding to areas in FIG. 2. Corners 271 are the corners where the bottom of field structure 130 meets mesa 200. The potential current paths referred to above are along mesa faces 272, overlap area surfaces 274, or along corners 271. The potential breakdown between poly 160 and the mesa corners 253 is no longer a problem, since the full thickness of the field insulator is now between the poly and corners 253. If charge is trapped in field structure 130, there is a danger that these potential charge paths may become actual paths and that current may flow along one or more of them between the source and drain of the transistor through the channel of a parasitic field effect transistor that has been turned on by the field from the trapped charge. Such a channel will have a threshold in electric field or voltage below which the channel does not conduct and above which it does conduct. The art attacks the problem by reducing trapping sites in sensitive geometric areas, such as along the top or side of a mesa between the source and drain of a transistor and/or by raising the voltage threshold of the parasitic device for current flow. There is little point in making the threshold voltage greater than the threshold voltage of the intended transistor. If the field insulation is clean enough, so that very little charge is trapped, the conventional processing of the mesa may be sufficient for some purposes.

Figure 4:
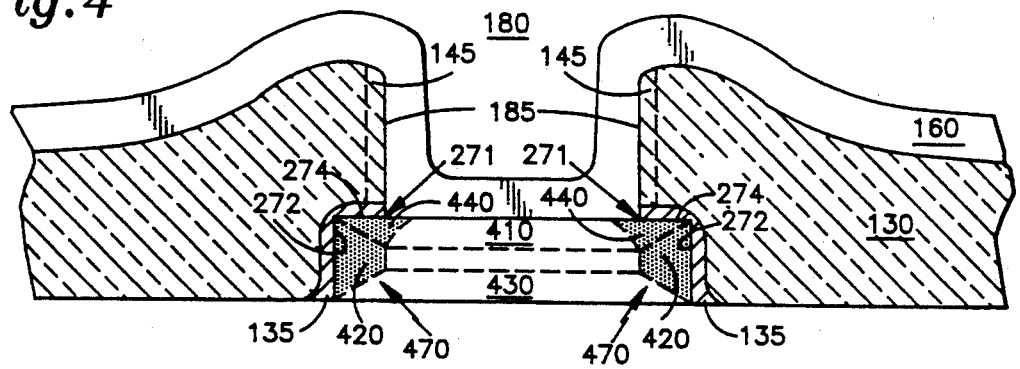
FIG. 4 is a cross section along the same line as FIG. 3, showing more detail.

Referring to FIG. 4, there is shown an enlarged view of mesa 200 through cross section B—B. Polysilicon strip 160 is the gate electrode, with oxide 135 being the gate oxide. An area 410 on the top of the mesa, is the intended channel of the transistor. Behind the right and left mesa faces 272, there are two parasitic channels 420, which are caused by sidewall inversion, caused by charge from exposure to ionizing radiation being collected within the portion of oxide 135 facing sides 272 of the mesa. At the bottom of mesa 200 there is a back channel 430. Below the walls 185 of aperture 180, there are additional regions labelled 440 that may be channels formed by charge collected at the corner 271 between sidewall 185 and mesa 200 or within the portion of oxide 135 facing the top surface 274. These areas 440 are formed on the top surface 274 of mesa 200 at the base of sidewall 185 where it is in contact with poly 160. Any of these sections, 420, 430, or 440 can give rise to a parasitic transistor and/or a current leakage path perpendicular to the plane of the paper.

Areas 440 and 420 below the overlap areas 274 are speckled to indicate the presence of an ion implant dose. This implant, which is preferably performed before the field insulator structure is put down, is used to eliminate the possibility of current flow perpendicular to the plane of the paper through a parasitic transistor channel in region 420 or 440 by raising the inversion threshold of the potential current paths. The implant could be performed after one or more layers of insulator 130 are put down, by using a higher accelerating voltage and tolerating more scatter. The magnitude of the implant dose is set to cause the final threshold voltage in operation of the corresponding parasitic transistors to be greater than the threshold voltage of transistor 190. If the thickness of mesa 200 warrants, the implant energy may be varied from a low energy of 40 kev for $BF_2$ implantation into P-well sidewalls to ensure that surface 274 has the correct implant dose to a greater voltage set to put the peak of the ion distribution deep enough in mesa 200 that the sidewall channels 420 on surfaces 272 are reasonably uniformly covered. For a mesa thickness of approximately 1500Å, the energies are set to put the ion distribution peaks $\frac{1}{3}$ and $\frac{2}{3}$ of the way through the mesa. Thicker mesas will require multiple energy distributions to get a uniform concentration. The energy may be varied continuously in a single step or several steps of discrete energies may be used. The implant distribution extends out past the edge of the mesa with sufficient tolerance for misalignment to ensure that surfaces 272 have their thresholds set as well as surfaces 274. The mesas of both N- and P-channel transistors will with suitable species be implanted.

Figure 5:
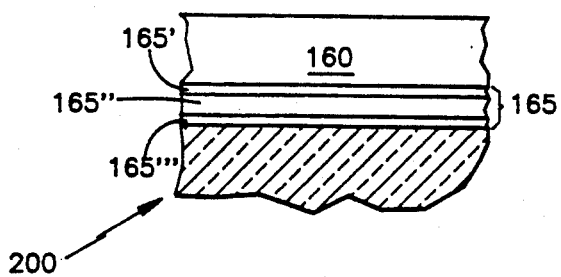
FIG. 5 shows details of the gate oxide fabricated according to the invention.
Figure 6:
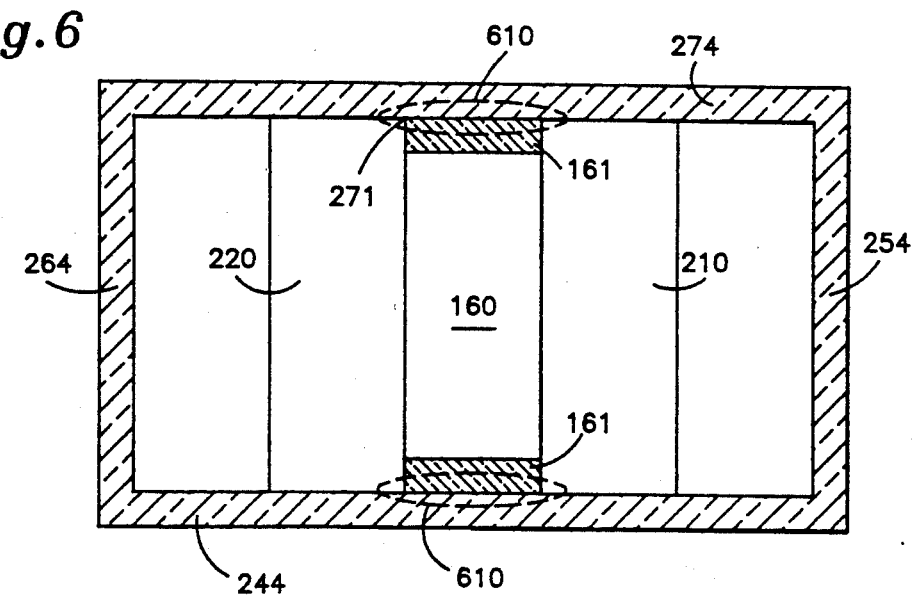
FIG. 6 shows a top view of the embodiment of FIG. 1.

In FIG. 6 there is shown a cross section in a plane through the top surface of gate 160. Two areas 161 are the vertical portions of the poly strip that forms gate 160. All around mesa 200 there is a rim that is the overlap area, comprising areas 244, 254, 264, and 274. The two dotted lines labelled 610 represent the area for the threshold implant described with respect to FIG. 5. Areas 610 will be referred to as the gate-sidewall transition areas or regions, since they are the places where the gate meets the sidewall and has a transition from the horizontal to the vertical. These regions extend under the field insulator structure 130 to allow for alignment tolerance and the possibility that charge influence will extend under the field insulator away from the sidewall. The implant may be performed over a larger area, of course, but this area denoted as 610 is the weakest one, since the path between source and drain is more important than other regions of potential leakage. Areas 610 are most conveniently implanted before field insulator 130 is put down, but the implant may be done after aperture 180 is cut, with reliance on diffusion to cause the dopant to extend slightly under structure 130.

In the illustrative embodiment, a set of silicon mesas having a thickness of approximately 1500Å, and having a protective oxide cover of 150Å of oxide that also serves to scatter the sidewall implant and protect the underlying silicon are formed in a commercially available wafer such as that available from Ibis Technology Corporation having a buried oxide layer approximately 3800Å thick. The upper silicon layer may be reduced in thickness by oxide growth to achieve a desired initial thickness. The buried oxide thickness is not relevant to the invention.

After the sidewall implant and the transistor threshold adjust implant, the field insulator structure is fabricated. First about 400Å of oxide 135 is grown. Since the buried oxide contains a considerable proportion of unreacted silicon, this layer will also grow somewhat. Next, a 2500Å layer of boron phosphosilicate glass of conventional composition is deposited across the wafer, followed by a 1000Å layer of undoped CVD oxide. Those skilled in the art may readily vary the field insulator layer to suit their requirements. An advantage of this configuration is that there is a weak point at the corners 253 in FIG. 2 where the poly gate passes over the thinner oxide at the corners that was present in prior art devices. With the present invention, the poly gate passes over the corners separated by a nominal thickness of between 3500Å and 3900Å of oxide in layers 140 and 150. Those skilled in the art would be reluctant to allow poly 160 to cross a higher step than the thickness of the mesa, since it is well known that the fewer and the smaller the steps, the better the yield. Preferably, the poly is doped when deposited to ensure good conductivity in the vertical portion that extends up the aperture walls. In the prior art, the poly step from the mesa down to the buried field oxide was only the nominal mesa thickness of about 1500Å. It has been found that the superior properties of field insulator 130 compensate for the additional step height.

Referring now to Table I and FIG. 5, there is illustrated a series of steps in a processing sequence that has the effect of substantially reducing leakage current due to exposure to ionizing radiation along aperture sidewalls and also produces an acceptable gate oxide. After the apertures 180 have been cut, the wafers are heated in an argon ambient. A preliminary purge step at 600° C. for 10 minutes serves to flush out oxidizing agents. The exposed areas are the sidewalls 185 and the top surface of mesa 200. The wafers are then ramped in an inert ambient to approximately 825° C.

TABLE I

| STEP | TEMP °C. | AMBIENT | TIME minutes |
|---|---|---|---|
| INSERT | 600 | argon | |
| PURGE | 600 | argon | 10 |
| RAMP UP | 825 | argon | 45 |
| STABILIZE | 825 | argon | 5 |
| DRY OXIDE | 825 | $O_2$ | 10 |
| WET OXIDE | 825 | 3 1/min $O_2$ 3.36 1/min $H_2$ | depends on thickness |
| DRY OXIDE | 825 | $O_2$ | 10 |
| PURGE | 825 | argon | 5 |
| RAMP UP | 900 | argon | 15 |
| ANNEAL | 900 | argon | 30 |
| RAMP DOWN | 600 | argon | 90 |
| WITHDRAW | 600 | argon | |

A first oxidation step of thermal oxidation is performed at a temperature of 825 C in an ambient dry $O_2$. This process is carried on for a time long enough to grow about 40 or 50 angstroms of high quality oxide 165' on surface 205, the top surface of mesa 200. On sidewall 185, the oxygen diffuses into the wall in a penetration layer 145 in FIG. 3. This and the other steps are performed at atmospheric pressure.

Next, a pyrogenic, or wet oxidation step is performed, in which hydrogen and oxygen combine exothermically in the presence of a flame to form a pure water vapor and oxygen ambient. The oxide 165" that is formed by this process is grown to a desired thickness of 200Å and is formed beneath layer 165', as shown in FIG. 5. The flow rates in Table I are for a chamber 170 mm in diameter and containing 5 inch wafers. Those skilled in the art will readily be able to adjust their parameters for different sizes.

In this step, hydrogen that is not formed into water serves to passivate damaged sites in the edge of the field oxide 185, shown in FIG. 3 as penetration layer 145. On the mesa, the hydrogen diffuses into the oxide layers 165' and 165" as they are formed.

In the final oxidation step, a second step of dry thermal oxidation lasting approximately 10 minutes at 825° C. grows several angstroms of a final oxide layer 165'''. During this step, some hydrogen is removed from the oxide layers 165' and 165" and from penetration layer 145 and an additional amount of oxygen diffuses into the field oxide structure. This step serves to change the properties of wet oxide layer 165" so that it has a greater resemblance to a dry thermal oxide, which is relatively devoid of hydrogen passivated dangling bond sites.

The removal of the hydrogen is the main effect of the second dry thermal oxidation step. It has been observed that the wall properties are slightly better with the second dry oxidation step than without it. The thickness of the second dry oxide layer 165''' is not critical. The growth of the oxide layer 165''' serves as an indicator that the oxygen has diffused through the entire layer, both on the mesa and on the sidewalls. The second dry thermal oxidation step is preferred, but could be dispensed with for applications with less stringent requirements. Those skilled in the art will readily be able to determine which of the alternatives is appropriate for their needs.

A final annealing step at 900° C. in argon is performed which drives off the remaining hydrogen present in the sidewall penetration layer 145 or in the gate oxides 165', 165" and 165''' and also serves to assist the reconstitution of broken silicon-oxygen bonds in the sidewall. The lower temperatures associated with this process compared with prior art processes ensure that higher boron doping levels remain in the silicon adjacent to surface 205.

The sequence may be summarized as consisting of a slow ramp up to a low oxidation temperature, followed by a "dry-wet-dry" sequence of low temperature oxidation steps. The slow ramping serves to ensure that the system is thermally stable, which has the benefit that film thickness is more uniform, since the wafers are at a uniform temperature. Additionally, insertion and removal of wafers, as well as ramps, are performed at a low temperature of about 600° C., all performed in an inert ambient, such as argon. The first thermal oxidation step serves to establish a diffusion barrier that slows down the pyrogenic process, giving more control over thickness. The thickness of the layer 165' may be varied to trade off growth time and accuracy.

The final step of thermal oxidation would not be thought advantageous to one skilled in the art, since it forms a relatively thin layer removed from the mesa. It serves to permit the diffusion of some of the excess hydrogen that has penetrated into the field insulator during the pyrogenic process. This excess hydrogen is beneficial, since it is available to tie up dangling bonds and/or to passivate the thin layer 145 near the surface of sidewall 185, but the presence of excess hydrogen would later be a disadvantage in the final product because hydrogen is very mobile, and once driven from a site would leave a dangling bond (or latent trapping site) behind and its presence is, therefore, no longer desired. This second dry thermal oxidation step also leaves some excess oxygen in the field, which is available to reconstitute damaged oxide in the subsequent annealing step.

In the case of mesas for N-channel transistors, the conventional dopant is boron, which is reduced in concentration during the oxidation process by escaping into the surrounding oxide regions and the atmosphere. The concentration reduction lowers the threshold voltage for parasitic channels 420 and 440. With high temperature processing of the mesa, a thin layer of silicon in the overlap area and on the sidewalls adjacent to oxide 135 is somewhat depleted in boron because of this effect. The greater adjacent oxide volume in field structure 130 causes boron to segregate into it. That portion of layer 135 near corners 271, where it is exposed to charge collecting in sidewall 185, is thus a potential channel that has a lower threshold than is desired. The higher the temperature during oxidation, the more rapid the dopant depletion. It is an advantage of this process that the relatively low temperatures involved compared with prior art gate processing reduces the amount of boron depletion under gate 160. It is a further advantage that less boron escapes through corners 271 from the mesa under oxide 135 during the gate oxide processing.

Boron segregates by diffusing out of the silicon to a degree that depends on the temperature of the oxidation process. A temperature of 850° C. is a dividing point for current technology where the deleterious effects of the low boron concentration become noticeable, but the development of technology will doubtless lower the temperature at which this surface effect is significant. A final set of process parameters results from tradeoffs, one of which is processing time versus dopant concentration.

The dopant concentration near the surface may be partially restored by diffusion from lower levels during subsequent high temperature steps. In the particular case of SOI, the mesas have less material that has not been depleted in dopant than do bulk processes. This problem becomes more severe as the mesa thickness decreases.

In the case of phosphorous dopants, the concentration becomes higher at a silicon-oxygen interface because the solubility of phosphorous is considerably less in oxide than in silicon. Parasitic transistor threshold under the field is not of concern for phosphorous doped P-channel devices because the parasitic threshold voltage magnitude increases as the surface concentration increases.

The changing concentrations at the surface will affect the transistor thresholds, however, and the threshold change will affect the circuit timing, since the turn-on time will be changed. The magnitude and direction of a threshold change will depend on the dopant species and transistor type, as well as the magnitude of the concentration change. For N-channel enhancement transistors having a boron dopant, a decrease in the concentration will decrease the threshold. For P-channel enhancement transistors having a phosphorus dopant, an increase in the dopant concentration will increase the threshold. Those skilled in the art will readily appreciate the effect of a concentration change on other types of transistors.

Approaches to maintaining the desired surface dopant concentration may involve additional doping steps to establish a concentration that will transform to the desired value after the high temperature steps have been completed and/or using low temperature processing to form the desired structure. For example, a surface implant of boron could be used, with a magnitude that will be reduced to the final value.

The drawback of the slow growth of thermal oxide layers is well known. Gate oxides grown entirely by a low temperature thermal process are not commercially acceptable. A method of forming an oxide layer according to the dry-wet or dry-wet-dry process has the substantial benefit of combining a low concentration of trapping sites from the dry step with reasonable speed from the pyrogenic step. As always, a production process will result from a complex set of tradeoffs. In rad-hard processing, a temperature of 850° C. is a conventional dividing point between the higher-defect high temperature regime and the lower-defect low temperature regime. The preferred compromise is to use a temperature of 825° C. for a dry-wet-dry gate oxide, together with a preimplant under the field structure and a threshold voltage adjust implant that allows for residual surface dopant concentration redistribution and/or segregation.

In addition to escape during the gate processing, there is an additional boron loss during the formation of oxide layer 135. A further option, therefore, is the use of the inventive process in the formation of layer 135. The use of low temperature dry thermal oxide suffers from the increase in processing time associated with a reduction in temperature. The use of the "dry-wet" or "dry-wet-dry" process to form the bottom layer of the field insulator structure 130 would raise the channel-formation threshold in overlap area 274 and sidewalls 272.

Although the process has been described with respect to a structure in which the field insulator overlaps the mesa, the benefits of reduced transistor leakage and more consistent dopant concentration apply to a more planar structure in which the field insulator is at the same height or even lower than the mesa top surface. A field insulator formed by a locos process or another equivalent process that eliminates the step of cutting apertures may also be used. The active devices may be formed in mesas, as shown in the drawings, or in bulk silicon.

It should be understood that the invention is not limited to the particular embodiments shown and described herein, but that various changes and modifications may be made without departing from the spirit and scope of this novel concept as defined by the following claims.

What is claimed is:

1. An integrated circuit, comprising:
   a silicon mesa disposed on a substrate;
   a field insulator structure, disposed in proximity to said mesa and having an opening formed therein extending downwardly to a top surface of said mesa, said opening exposing sidewalls in said field insulator structure, said opening being positioned with respect to said mesa and having dimensions such that said field insulator structure is disposed to overlap a region of said mesa along an outer periphery of said mesa;
   a layer of polysilicon extending along a top surface of said field insulator structure and into said opening and adjacent to said mesa top surface; and
   an insulator disposed between said polysilicon layer and said mesa top surface, said insulator having a layer of thermal gate oxide disposed adjacent to said polysilicon layer, said insulator having a layer of pyrogenic oxide disposed between said thermal gate oxide layer and said mesa top surface.

2. The integrated circuit of claim 1, wherein said mesa has formed therein a source and a drain of a transistor, said polysilicon layer comprising a gate of said transistor, said insulator comprising a gate insulator of said transistor.

3. The integrated circuit of claim 1, further comprising a second layer of thermal gate oxide disposed between said layer of pyrogenic oxide and said mesa top surface.

4. The integrated circuit of claim 1, wherein said field insulator structure comprises:
   a layer of thermal oxide, disposed to overlap said region of said mesa along said outer periphery of said mesa.

5. The integrated circuit of claim 4, wherein said field insulator structure further comprises:
   a layer of boron phospho-silicate, disposed adjacent to said layer of thermal oxide; and
   a layer of oxide, disposed above said layer of boron phospho-silicate.

6. An integrated circuit, comprising:

a silicon mesa disposed on a substrate;

a field insulator structure, disposed in proximity to said mesa and having an opening formed therein extending downwardly to a top surface of said mesa, said opening exposing sidewalls in said field insulator structure, said opening being positioned with respect to said mesa and having dimensions such that said field insulator structure is disposed to overlap a region of said mesa along an outer periphery of said mesa;

a layer of polysilicon extending along a top surface of said field insulator structure and into said opening and adjacent to said mesa top surface; and an insulator disposed between said polysilicon layer and said mesa top surface, said insulator having a layer of thermal gate oxide disposed adjacent to said polysilicon layer, said insulator having a layer of pyrogenic oxide disposed between said thermal gate oxide layer and said mesa top surface;

as characterized by:

said layer of thermal gate oxide being formed by a process comprising the step of growing said thermal gate oxide in an ambient oxygen environment at atmospheric pressure such that said oxygen diffuses into said sidewalls of said field insulator structure at a predetermined penetration layer thickness; and said layer of pyrogenic oxide being formed by a process comprising the step of growing said pyrogenic oxide in an ambient hydrogen atmosphere, said hydrogen diffusing into said sidewalls of said field insulator structure at said penetration layer thickness, a portion of said hydrogen that is not formed into water in said step of growing said pyrogenic oxide being operable to passivate any damaged regions in said field insulator structure at said penetration layer thickness.

7. The integrated circuit of claim 6, wherein said mesa has formed therein a source and a drain of a transistor, said polysilicon layer comprising a gate of said transistor, said insulator comprising a gate insulator of said transistor.

8. The integrated circuit of claim 6, further comprising a second layer of thermal gate oxide disposed between said layer of pyrogenic oxide and said mesa top surface; as characterized by:

said second layer of thermal gate oxide being formed by a process comprising the step of growing said thermal gate oxide in an ambient oxygen environment at atmospheric pressure such that said oxygen diffuses into said sidewalls of said field insulator structure at a predetermined penetration layer thickness, said step of growing said second layer of said thermal gate oxide being operable to remove a portion of said hydrogen from both said sidewalls of said field insulator structure and said layer of pyrogenic oxide.

9. The integrated circuit of claim 6, wherein said field insulator structure comprises:

a layer of thermal oxide, disposed to overlap said region of said mesa along said outer periphery of said mesa.

10. The integrated circuit of claim 9, wherein said field insulator structure further comprises:

a layer of boron phospho-silicate, disposed adjacent to said layer of thermal oxide; and a layer of oxide, disposed above said layer of boron phospho-silicate.

* * * * *